(12) United States Patent
Grivna

(10) Patent No.: US 6,621,136 B2
(45) Date of Patent: Sep. 16, 2003

(54) SEMICONDUCTOR DEVICE HAVING REGIONS OF LOW SUBSTRATE CAPACITANCE

(75) Inventor: Gordon M. Grivna, Mesa, AZ (US)

(73) Assignee: Semiconductor Components Industries LLC, Phoenix, AZ (US)

( * ) Notice: Subject to any disclaimer, the term of this patent is extended or adjusted under 35 U.S.C. 154(b) by 0 days.

(21) Appl. No.: 09/964,727

(22) Filed: Sep. 28, 2001

(65) Prior Publication Data

US 2003/0062588 A1 Apr. 3, 2003

(51) Int. Cl.[7] .......................... H01L 29/76; H01L 29/00
(52) U.S. Cl. ......................... 257/510; 257/410
(58) Field of Search .................. 257/510, 410, 257/212, 309

(56) References Cited

U.S. PATENT DOCUMENTS

| 4,745,081 | A | | 5/1988 | Beyer et al. ............... 437/38 |
|---|---|---|---|---|
| 5,641,712 | A | | 6/1997 | Grivna et al. ............. 438/624 |
| 5,742,091 | A | | 4/1998 | Hebert ..................... 257/531 |
| 6,136,687 | A | * | 10/2000 | Lee et al. .................. 438/421 |
| 6,180,995 | B1 | * | 1/2001 | Hebert ..................... 257/528 |
| 6,208,015 | B1 | * | 3/2001 | Bandyopadhyay et al. . 257/635 |
| 6,297,554 | B1 | * | 10/2001 | Lin ........................... 257/752 |
| 6,307,247 | B1 | | 10/2001 | Davies ..................... 257/522 |
| 2002/0014679 | A1 | * | 2/2002 | Lee et al. .................. 257/522 |

* cited by examiner

Primary Examiner—Amir Zarabian
Assistant Examiner—Kiesha Rose
(74) Attorney, Agent, or Firm—James J. Stipanuk

(57) ABSTRACT

A semiconductor device (10) includes an electrical component (70) formed on a dielectric region (22) of a semiconductor substrate (12). The dielectric region is formed with a first plurality of voids (58) extending into the substrate to a first depth ($D_{31}$) and a second plurality of voids (56) extending into the semiconductor substrate to a second depth ($D_{30}$) greater than the first depth.

12 Claims, 4 Drawing Sheets

SEMICONDUCTOR DEVICE HAVING REGIONS OF LOW SUBSTRATE CAPACITANCE

BACKGROUND OF THE INVENTION

The present invention relates in general to semiconductor devices and, more particularly, to integrated circuits having components formed on a low capacitance region of a semiconductor die.

Semiconductor technology continues to scale transistors to have smaller dimensions in order to provide increased functionality and a higher frequency capability. For example, wireless communication devices often use integrated circuits that include high density digital signal processing functions on the same die as analog circuits operating at frequencies in excess of five gigahertz.

However, some integrated circuit components, such as passive devices, are not readily scalable. These devices have relatively high parasitic substrate capacitances, which often limits the overall frequency capability of an integrated circuit. For example, inductors are not easily reduced in size without reducing their quality factor or inductance to an unacceptable level, and bonding pads are not scalable because of the need to attach wire bonds to the bonding pads.

A variety of techniques have been tried to reduce the parasitic capacitances of passive integrated circuit components. One such technique is to form the components over a low permittivity material. However, current low permittivity materials are limited to film thicknesses that are too thin to produce a substantial reduction in parasitic capacitance. Another approach is to form the components over a thick dielectric film in which are formed air gaps or voids that reduce the overall permittivity of the dielectric film. However, previous films made with such voids introduce substantial stress in a semiconductor substrate, which degrades the performance and reliability of the integrated circuit. Other schemes reduce the stress by producing fewer voids or voids with only a limited volume, which has a correspondingly limited effect on parasitic capacitance. Moreover, if the voids are formed before the transistors, gases within the voids can leak into the processing chambers during critical fabrication steps to contaminate integrated circuit components and reduce the yield and/or reliability.

Hence, there is a need for a low capacitance structure and method of making an integrated circuit that maintains a low cost while reducing die stress and avoiding the introduction of contaminants into the integrated circuit.

DETAILED DESCRIPTION OF THE DRAWINGS

In the figures, elements having the same reference number have similar functionality.

Figure 1:
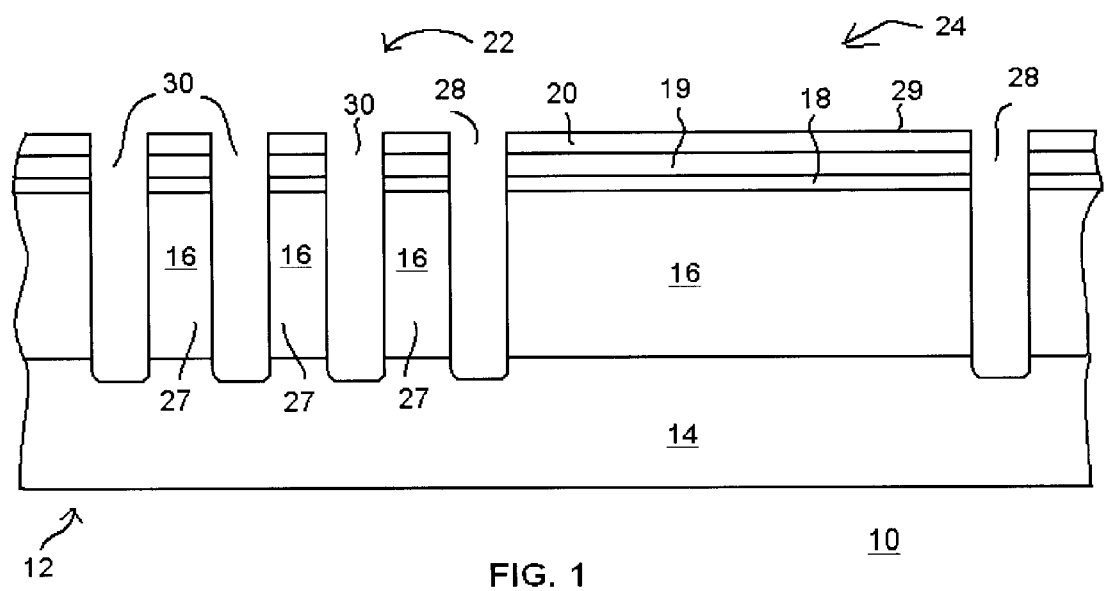
FIG. 1 is a cross-sectional view of an integrated circuit after a first fabrication stage.

FIG. 1 is a cross-sectional view of an integrated circuit 10 formed with a semiconductor substrate 12 after a first processing stage. Integrated circuit 10 includes an isolation region 22 for forming electrical components such as passive devices and bonding pads. Integrated circuit 10 further includes an active region 24 for forming transistors and other active devices.

A base layer 14 is formed to have a thickness of about two hundred fifty micrometers. In one embodiment, base layer 14 is heavily doped to have a p-type conductivity and a resistivity of about 0.01 ohm-centimeters to function as a ground plane for integrated circuit 10. In one embodiment, base layer 14 comprises monocrystalline silicon.

An epitaxial layer 16 is grown to a thickness of about three micrometers over base layer 14. In one embodiment, epitaxial layer 16 comprises monocrystalline silicon doped to have a p-type conductivity and a resistivity of about twenty ohm-centimeters.

A dielectric layer 18 is formed over epitaxial layer 16 to a thickness of about seven hundred angstroms. In one embodiment, dielectric layer 18 is formed with a thermally grown silicon dioxide.

A dielectric layer 19 is formed over dielectric layer 18 to a thickness of about one thousand five hundred angstroms. In one embodiment, dielectric layer 19 comprises silicon nitride.

A dielectric layer 20 is formed over dielectric layer 20 to a thickness of about two thousand angstroms. In one embodiment, dielectric layer 20 is formed with tetra-ethyl orthosilicate (TEOS).

A surface 29 of substrate 12 is patterned with photoresist to mask a series of standard etch steps that remove exposed portions of dielectric layers 18–20. A standard anisotropic silicon etch is then applied to remove exposed portions of epitaxial layer 16 and base layer 14 to form a trench 28 around active region 24. The same etch step is concurrently used to form a matrix of trenches 30 within isolation region 22. Since trench 28 and trenches 30 are processed using the same fabrication steps, they have substantially the same depths at this stage of processing although their respective widths may vary. However, trench 28 and trenches 30 are designated with different reference numbers because of differences in their subsequent processing. In one embodiment, trenches 28 and 30 are formed to a depth of about ten micrometers, a width of about two micrometers and about two micrometers of separation between adjacent trenches. The etching step leaves an array of monocrystalline silicon pillars 27.

Figure 2:
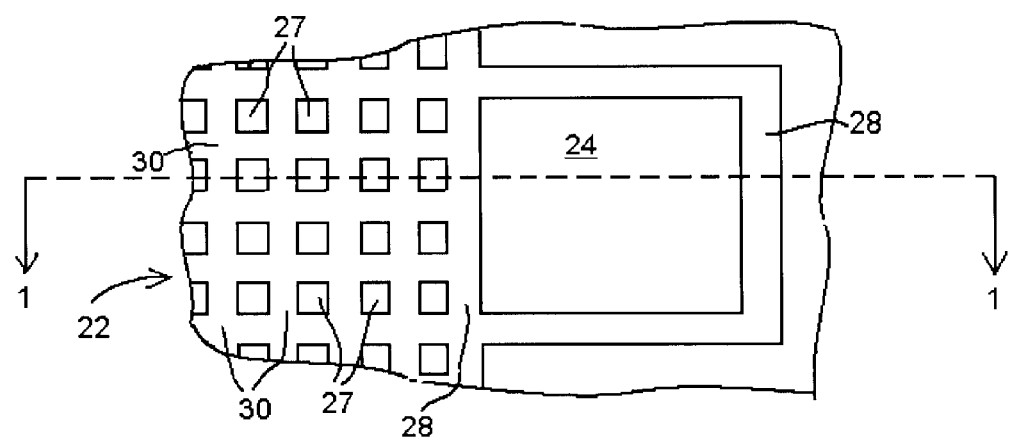
FIG. 2 is a top view of the integrated circuit after the first fabrication stage.

FIG. 2 is a top view of integrated circuit 10 showing features of isolation region 22 and active region 24 after the processing stage described in FIG. 1. Trench 28 surrounds, and effectively defines, active region 24 as shown. Trenches 30 are arranged in a matrix or grid as described above to define pillars 27. As will be apparent from the subsequent processing steps, a variety of alternate arrangements can be used to form trenches 30. For example, an array of holes could be etched to form trenches 30, effectively reversing the positions of pillars 27 and trenches 30. That is, pillars 30 can be formed as a contiguous matrix while trenches 30 are etched as an array of discrete holes. Alternatively, trenches 30 may be formed as a series of parallel trenches within isolation region 22.

Figure 3:
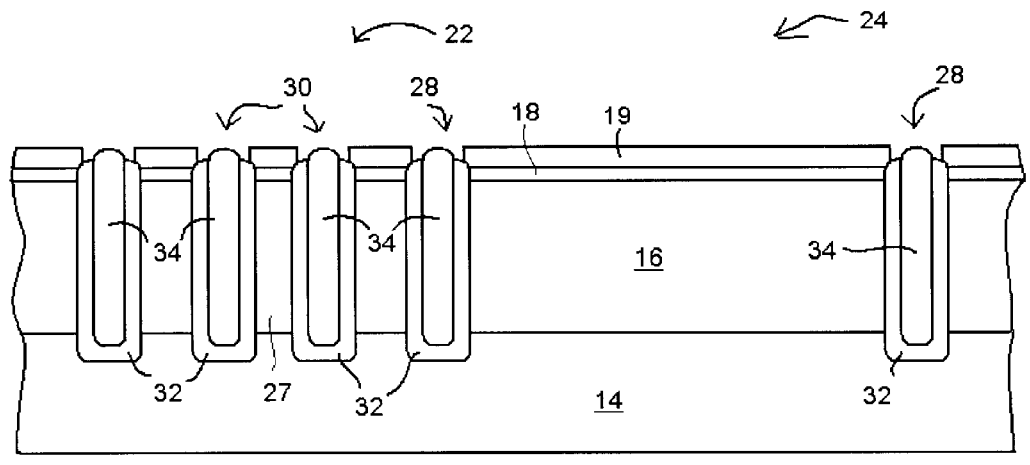
FIG. 3 is a cross-sectional view of the integrated circuit after a second fabrication stage.

FIG. 3 shows a cross-sectional view of integrated circuit 10 after a second fabrication stage. Dielectric layer 20 is removed with a standard silicon dioxide etch to leave silicon nitride dielectric layer 19 to function as a hard mask. A thermal silicon dioxide dielectric layer 32 is then grown along exposed silicon surfaces so that surfaces of trenches 28 and 20 are lined with a thermally grown silicon dioxide. In one embodiment, dielectric layer 32 is formed to a thickness of about two thousand angstroms.

A blanket polysilicon layer is deposited and a standard blanket etchback step is applied to remove excess polysilicon to form a fill layer 34 that fills trenches 28 and 30 but does not extend above dielectric layer 19. The blanket etchback step removes polysilicon from the upper surface of dielectric layer 19 to facilitate subsequent planarization steps. In one embodiment, fill layer 34 is formed by depositing about eight thousand angstroms of polysilicon material. In an alternate embodiment, fill layer 34 may be formed by depositing TEOS to a similar thickness so that fill layer 34 comprises silicon dioxide.

Figure 4:
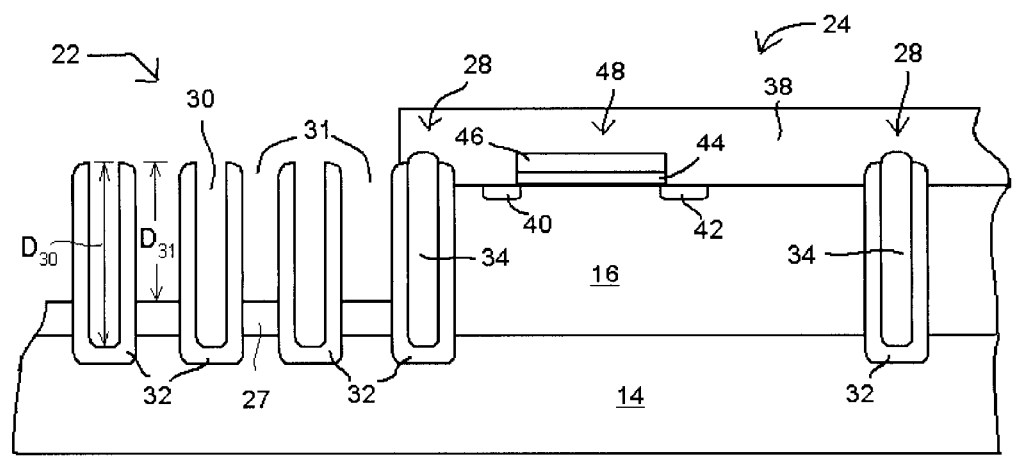
FIG. 4 is a cross-sectional view of the integrated circuit after a third fabrication stage.

FIG. 4 shows a cross-sectional view of integrated circuit 10 after a third fabrication stage. Dielectric layers 18 and 19 are patterned and/or removed and an n-channel metal-oxide-semiconductor field-effect transistor 48 is formed in active region 24 as follows. A dielectric material is thermally grown over epitaxial layer 16 and a polysilicon material is deposited over the dielectric material. The polysilicon and dielectric materials are patterned and etched to form a gate dielectric 44 and an overlying gate electrode 46 of transistor 48 as shown. Gate dielectric 44 and gate electrode 46 are used in combination with a photoresist layer (not shown) to form a mask for introducing n-type dopants into epitaxial layer 16 to form a self-aligned source 40 and drain 42 of transistor 48. In one embodiment, source 40 and drain 42 are heavily doped and formed to a depth of about 0.5 micrometers.

A standard photoresist material is deposited and patterned to form a mask layer 38 which exposes isolation region 22 and covers active region 24 including at least a portion of trench 28. Mask layer 38 may cover only a portion of trench 28, but it should cover active region 24 completely in order to prevent semiconductor material within active region 24 from being removed, i.e., from epitaxial layer 16, during the following step.

A standard anisotropic etch is applied to remove any material covering the semiconductor material which is to be removed. Then, a standard isotropic silicon etch is applied to remove the polysilicon material of fill layer 34 to effectively reopen trenches 30. In the same etch step, semiconductor material is removed from pillars 27 to leave layer 32 projecting from pillars 27 to form trenches 31 adjacent to dielectric layer 32 as shown. Note that the monocrystalline structure of pillars 27 results in their being etched at a slower rate than the polycrystalline structure of fill layer 34. As a result, the depth $D_{30}$ of trenches 30 is greater than the depth $D_{31}$ of trenches 31.

Note that a filled trench similar to trench 28 is formed around isolation region 22 in order to provide an etch stop around the perimeter of isolation region 22 during the isotropic etch step.

Figure 5:
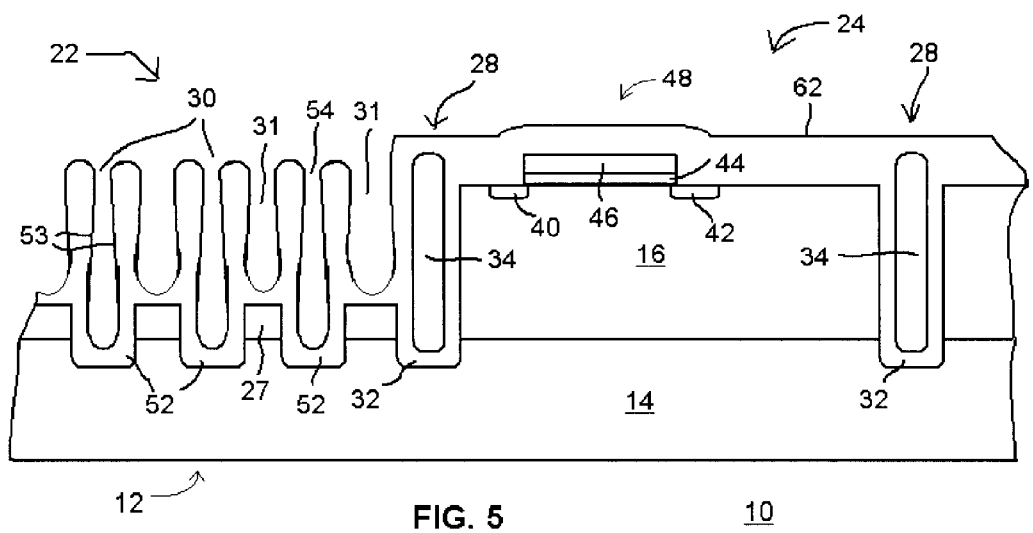
FIG. 5 is a top view of the integrated circuit after a fourth fabrication stage.

FIG. 5 shows a cross-sectional view of integrated circuit 10 after a fourth fabrication stage. Photoresist layer 38 is removed using a standard removal process. Substrate 12 is placed in a plasma chamber (not shown) and a dielectric material such as silicon dioxide is deposited in a blanket fashion to form a dielectric layer 62 over active region 24. Concurrently, the dielectric material is deposited on surfaces of isolation region 22, where it adheres to surfaces of trenches 30 and 31 and covers dielectric layer 32 to form a dielectric region 52. In one embodiment, dielectric region 52 has an internal portion comprising a thermally grown silicon dioxide from dielectric layer 32, and an outer covering that comprises a deposited silicon dioxide with a less dense structure.

The sharp vertical structure of dielectric layer 32 and the narrow widths of trenches 30 and 31 cause dielectric material to be deposited more heavily on upper portions of dielectric layers 32 than on the lower portions. As a result, sidewalls 53 of dielectric region 52 are tapered and openings 54 of trenches 30 and 31 are narrowed. The dielectric material also is deposited over pillars 27 as shown.

Figure 6:
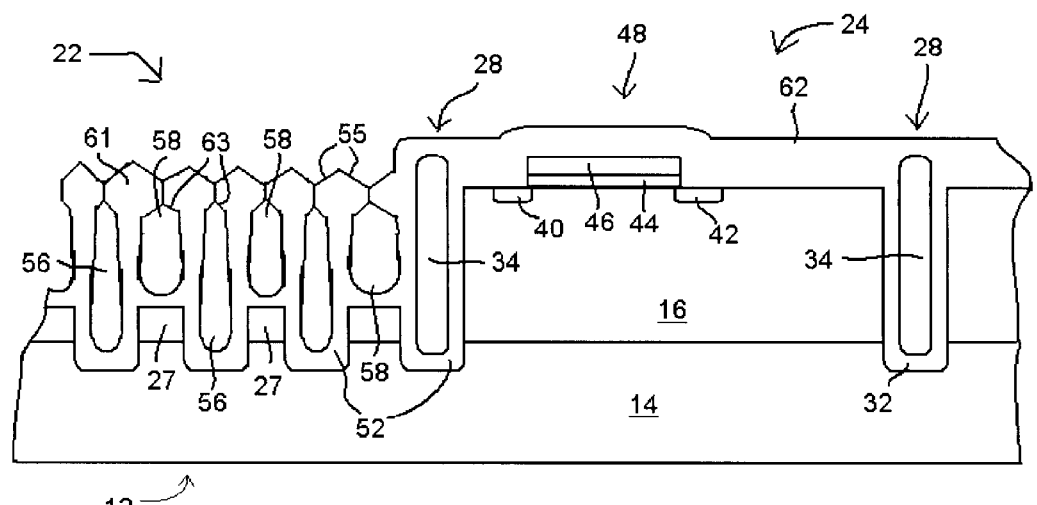
FIG. 6 is a cross-sectional view of the integrated circuit after a fifth fabrication stage.

FIG. 6 shows a cross-sectional view of integrated circuit 10 after a fifth fabrication stage. A blanket low temperature sputter etch is performed, which removes dielectric material from the peaks of dielectric region 52 to reduce their height. The sputter etch is performed at a high pressure, which causes the removed material to be redeposited on the peaks to effectively seal off openings 54 of trenches 30 and 31 to form a cap layer 61. In one embodiment, the sputter etch step is performed in an argon atmosphere at a pressure ranging between one hundred millitorr and two torr and a temperature of about forty degrees Celsius. The result is an array of gaseous gaps or voids 56 formed in trenches 30 and voids 58 formed in trenches 31 which are sealed off by a surface 63 of cap layer 61.

Voids 56 and 58 are so designated because they are filled with a gaseous material, which in one embodiment may be air. Voids 56 and 58 may also be filled with argon or another ambient gas which is present when openings 54 become sealed off.

Note that voids 56 and 58 are formed late in the process, i.e., after transistor 48 is formed. During the formation of transistor 48, trenches 28 and 30 are filled with polysilicon of fill layer 34 to provide structural rigidity and strength during critical steps in the fabrication of transistor 48, such as growing gate dielectric 44. Only after transistor 48 has been formed is semiconductor material removed to form voids 56 and 58 at the back end of the processing flow. This sequence improves the reliability of integrated circuit 10 by effectively eliminating gases trapped in voids that can leak out during the critical processing steps to contaminate gate dielectric 44 or other transistor elements. Reliability is further improved because the fill material is removed after active devices are formed, which avoids subjecting voids to high temperature processing steps which can lead to stress-induced damage and/or contamination.

Figure 7:
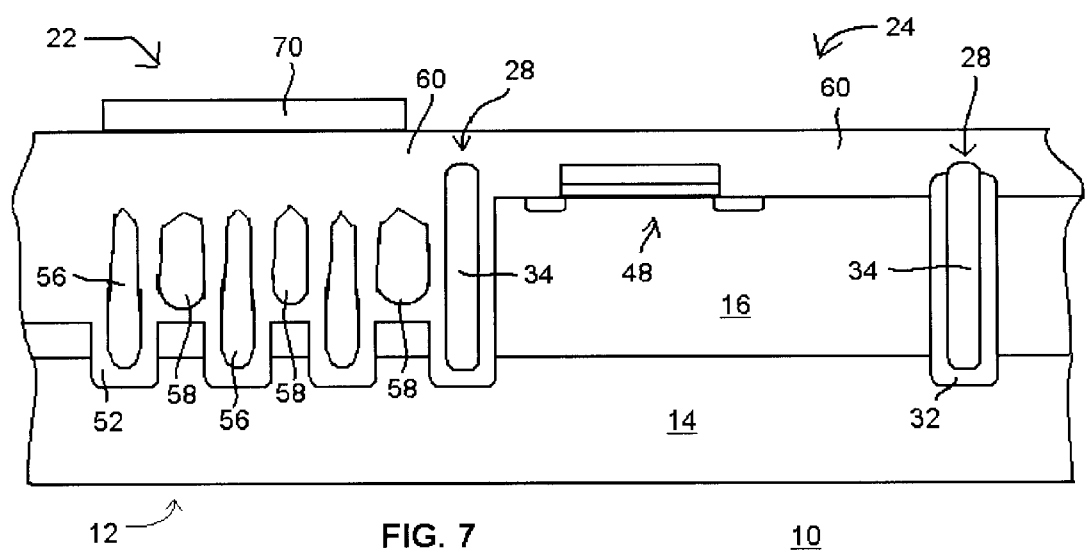
FIG. 7 is a cross-sectional view of the integrated circuit after a sixth fabrication stage.

FIG. 7 shows a cross-sectional view of integrated circuit 10 after a sixth fabrication stage. Dielectric material is deposited on substrate 12 and planarized to form a cap layer 60 that includes material from cap layer 61 to further seal off voids 56 and 58. Cap layer 60 may also function as an interlayer dielectric that separates metallization interconnect layers. In one embodiment, the dielectric material used to form cap layer 60 is silicon dioxide. Since the high pressure sputter etch step described in FIG. 6 reduces the overall peaks of dielectric region 52, the amount of material necessary to form a planarized surface on cap layer 60 between isolation region 22 and active region 24 is proportionately reduced as well, which reduces the deposition processing time and the fabrication cost of integrated circuit 10. In one embodiment, cap layer 60 is formed to have a thickness of about 0.5 micrometers over active region 24.

Recall that trenches 30 have a depth $D_{30}$ greater than the depth $D_{31}$ of trenches 31. Since trenches 30–31 undergo similar processing after the isotropic silicon etch step described in FIG. 4, the depth $D_{56}$ of voids 56, which are formed in trenches 30, is greater than the depth $D_{58}$ of voids 58, which are formed in trenches 31.

The effective dielectric constant of isolation region 22 is a combination of the dielectric constant or permittivity of voids 56 and 58 and the permittivity of the material used to form dielectric region 52 and cap layer 60. In one embodiment, dielectric region 52 is formed with silicon dioxide, whose dielectric constant is about 3.9. Since the gaseous material contained in voids 56 and 58 has a dielectric constant substantially equal to one, the overall dielectric constant of isolation region is less than 3.0, depending on the relative volumes of dielectric region 52 and air gasps 56 and 58. Hence, isolation region 22 has a low effective permittivity for forming electrical components with a low parasitic substrate capacitance.

In certain applications, a lower fabrication cost and/or a higher strength is desired while a somewhat higher effective permittivity is acceptable. In such a case, dielectric layers 18 and 19 may be patterned to remain over pillars 27 to prevent monocrystalline semiconductor material from being removed during the silicon etch described in FIG. 4, i.e., when polycrystalline silicon material is removed to form trenches 30. In such a case, trenches 31 would not be formed, so voids 56 would be formed in trenches 30 but voids above pillars 27 would not be formed at all. The resulting structure would have a higher effective permittivity but would also have a higher strength due to the increased height of pillars 27. Moreover, since the time required to perform the silicon etch could be reduced, integrated circuit 10 would be fabricated at a lower cost.

An electrical component 70 is formed on cap layer 60 over isolation region 22. The electrical component has a low parasitic capacitance, and therefore a higher frequency capability, because of the low permittivity of isolation region 22. Electrical component 70 may be a bonding pad, a passive component such as an inductor, capacitor or resistor, or another electrical device suitable for formation over a dielectric material.

In summary, the present invention provides a semiconductor device that has an electrical component formed over a dielectric region of a semiconductor substrate. The dielectric region includes a first plurality of voids extending into the semiconductor substrate to a first depth and a second plurality of voids extending into the semiconductor substrate to a second depth greater than the first depth. The semiconductor device is formed by filling a trench with a semiconductor material, where the trench is lined with a dielectric material. The semiconductor material is then etched to create a first void in the trench that reduces a permittivity of the dielectric region.

What is claimed is:

1. A semiconductor device, comprising:

an electrical component; and a semiconductor substrate having a dielectric region for forming the electrical component, where the dielectric region includes a first plurality of voids extending into the semiconductor substrate to a first depth and a second plurality of voids extending into the semiconductor substrate to a second depth greater than the first depth.

2. The semiconductor device of claim 1, wherein the dielectric region includes a cap layer having a surface for sealing voids of the first and second pluralities of voids.

3. The semiconductor device of claim 2, wherein the electrical component is formed over the cap layer.

4. The semiconductor device of claim 1, wherein the electrical component comprises a passive device or bonding pad of the semiconductor device.

5. The semiconductor device of claim 1, further comprising an active device formed in an active region of the semiconductor substrate.

6. The semiconductor device of claim 1, wherein the semiconductor substrate is formed with silicon.

7. The semiconductor device of claim 1, wherein the dielectric region is formed with silicon dioxide.

8. The semiconductor device of claim 1, where the first plurality of voids extend into the semiconductor substrate to the first depth of at east five micrometers.

9. A semiconductor device, comprising:

a semiconductor substrate having a surface for defining a first trench having a first depth and a second trench having a second depth greater than the first depth; and a dielectric material disposed on the surface for sealing a first void in the first trench and a second void in the second trench.

10. The semiconductor device of claim 9, wherein the second void is formed at a greater distance from the surface than the first void.

11. The semiconductor device of claim 9, wherein the dielectric material in hides silicon dioxide.

12. The semiconductor device of claim 9, further comprising an electrical component formed to overlie the first and second trenches.

* * * * *